United States Patent
Cho et al.

(10) Patent No.: US 10,998,303 B2
(45) Date of Patent: May 4, 2021

(54) METHOD OF MANUFACTURING PACKAGE-ON-PACKAGE DEVICE AND BONDING APPARATUS USED THEREIN

(71) Applicant: SAMSUNG ELECTRONIC CO., LTD., Suwon-si (KR)

(72) Inventors: Junho Cho, Chungcheongnam-do (KR); Ohchul Kwon, Chungcheongnam-do (KR); Seungjin Cheon, Chungcheongnam-do (KR); Tea-Geon Kim, Chungcheongnam-do (KR); Bubryong Lee, Chngcheongnam-do (KR); Junglae Jung, Chungcheongnam-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 176 days.

(21) Appl. No.: 16/167,154

(22) Filed: Oct. 22, 2018

(65) Prior Publication Data

US 2019/0273074 A1    Sep. 5, 2019

(30) Foreign Application Priority Data

Mar. 5, 2018   (KR) .......................... 10-2018-0025772

(51) Int. Cl.
*H01L 25/00* (2006.01)
*H01L 23/00* (2006.01)
(Continued)

(52) U.S. Cl.
CPC ............ *H01L 25/50* (2013.01); *H01L 21/565* (2013.01); *H01L 23/5385* (2013.01);
(Continued)

(58) Field of Classification Search
CPC ......... H01L 25/50; H01L 24/17; H01L 24/46; H01L 24/73; H01L 24/81; H01L 24/85;
(Continued)

(56) References Cited

U.S. PATENT DOCUMENTS 7,886,796 B2   2/2011   Ok
8,759,158 B2   6/2014   Takahashi
(Continued)

FOREIGN PATENT DOCUMENTS

JP   2001148403 A    5/2001
KR   100458414 B1   11/2004
(Continued)

*Primary Examiner* — Mohammad M Choudhry
(74) *Attorney, Agent, or Firm* — Volentine, Whitt & Francos, PLLC

(57) ABSTRACT

A method of manufacturing a package-on-package device includes a bonding step carried out by a bonding apparatus including a pressing member and a light source that produces a laser beam. A bottom package including a lower substrate, lower solder balls alongside an edge of the lower substrate, and a lower chip on a center of the lower substrate is provided, the bottom package is bonded to an interposer substrate having upper solder balls aligned with the lower solder balls, and a top package having an upper substrate and an upper chip on the upper substrate is bonded to the interposer substrate. While the interposer substrate is disposed on the bottom package, the pressing member presses the interposer substrate against the bottom package, and the laser beam adheres the lower solder balls to the upper solder balls.

18 Claims, 7 Drawing Sheets

(51) Int. Cl.
*H01L 25/18* (2006.01)
*H01L 23/538* (2006.01)
*H01L 21/56* (2006.01)

(52) U.S. Cl.
CPC .............. *H01L 24/09* (2013.01); *H01L 24/17* (2013.01); *H01L 24/32* (2013.01); *H01L 24/46* (2013.01); *H01L 24/73* (2013.01); *H01L 24/81* (2013.01); *H01L 24/85* (2013.01); *H01L 24/91* (2013.01); *H01L 24/92* (2013.01); *H01L 25/18* (2013.01); *H01L 24/16* (2013.01); *H01L 24/29* (2013.01); *H01L 24/48* (2013.01); *H01L 2224/13101* (2013.01); *H01L 2224/16145* (2013.01); *H01L 2224/16225* (2013.01); *H01L 2224/2919* (2013.01); *H01L 2224/32225* (2013.01); *H01L 2224/48227* (2013.01); *H01L 2224/73253* (2013.01); *H01L 2224/73257* (2013.01); *H01L 2224/73265* (2013.01); *H01L 2224/81801* (2013.01); *H01L 2224/92225* (2013.01); *H01L 2225/107* (2013.01); *H01L 2924/00014* (2013.01); *H01L 2924/15311* (2013.01); *H01L 2924/181* (2013.01); *H01L 2924/1815* (2013.01); *H01L 2924/18161* (2013.01)

(58) Field of Classification Search
CPC ..................... H01L 24/91; H01L 25/18; H01L 2224/73257; H01L 2225/107
See application file for complete search history.

(56) References Cited

U.S. PATENT DOCUMENTS

| | | |
|---|---|---|
| 9,385,103 B2 | 7/2016 | Sano et al. |
| 2008/0092821 A1 | 4/2008 | Otsuka et al. |
| 2009/0289101 A1* | 11/2009 | Du ................ H05K 3/3436 228/180.22 |
| 2014/0367854 A1* | 12/2014 | Zhao ............ H01L 23/49833 257/738 |
| 2015/0041525 A1 | 2/2015 | Tanimoto et al. |
| 2015/0053350 A1* | 2/2015 | Han ............... H01L 21/67092 156/381 |
| 2015/0206869 A1* | 7/2015 | Kim .............. H01L 23/49816 438/109 |
| 2016/0056091 A1* | 2/2016 | Kim ................... H01L 23/552 257/368 |
| 2016/0240457 A1* | 8/2016 | Lee ..................... H01L 24/05 |
| 2017/0057019 A1 | 3/2017 | Lee et al. |
| 2017/0141071 A1* | 5/2017 | Choi ................... H01L 25/50 |

FOREIGN PATENT DOCUMENTS

| | | |
|---|---|---|
| KR | 100662820 B1 | 12/2006 |
| KR | 101245356 B1 | 3/2013 |
| KR | 101283405 B1 | 7/2013 |
| KR | 1020170026770 A | 3/2017 |

\* cited by examiner

US 10,998,303 B2

METHOD OF MANUFACTURING PACKAGE-ON-PACKAGE DEVICE AND BONDING APPARATUS USED THEREIN

PRIORITY STATEMENT

This U.S. nonprovisional application claims priority under 35 U.S.C § 119 to Korean Patent Application No. 10-2018-0025772 filed on Mar. 5, 2018, in the Korean Intellectual Property Office, the entire contents of which are hereby incorporated by reference.

BACKGROUND

The inventive concept relates to package-on-package devices. More particularly, the inventive concept relates to a method of manufacturing a package-on-package device and to a bonding apparatus operative to bond a plurality of stacked semiconductor packages.

The demands for higher performance, higher speed, and more compact electronic products have increased. In order to develop electronics that meet these demands, numerous semiconductor device technologies such as the stacking of a plurality of semiconductor chips on a single package substrate or the stacking of one package on another package to form a package-on-package (POP) device have been considered. However, each of these technologies gives rise to certain challenges in design and in connection with the manufacturing process.

SUMMARY

According to the inventive concept, there is provided a method of manufacturing a package-on-package device, comprising providing a bottom semiconductor package having a lower substrate, lower solder balls on an outer peripheral part of a top surface of the lower substrate, and a lower chip on central part of the top surface of the lower substrate, bonding an interposer substrate having upper solder balls to the bottom semiconductor package, and bonding a top semiconductor package to the interposer substrate. The top semiconductor package has an upper substrate and an upper chip on the upper substrate. The bonding of the interposer substrate to the bottom semiconductor package comprises providing the interposer substrate on the bottom semiconductor package with the upper solder balls of the interposer substrate aligned with the lower solder balls of the bottom semiconductor package, pressing the interposer substrate against the bottom semiconductor package, and irradiating the interposer substrate with a laser beam to adhere the lower solder balls to the upper solder balls.

According to the inventive concept, there is also provided a method of manufacturing a package-on-package device, comprising providing a bottom semiconductor package having a lower substrate including a top surface and a bottom surface, first balls or bumps of solder spaced from one another along an outer peripheral part of the top surface of the lower substrate, and a lower chip on central part of the top surface of the lower substrate, providing an interposer having an intermediate substrate including a top surface and a bottom surface, second balls or bumps of solder spaced from one another along an outer peripheral part of the bottom surface of the intermediate substrate, and conductive pads disposed on the top surface of the intermediate substrate and vias extending in the intermediate substrate and connecting the conductive pads to the second balls or bumps of solder, setting the interposer atop the bottom semiconductor package with the bottom surface of the intermediate substrate facing the top surface of the lower substrate and the second balls or bumps of solder disposed in correspondence with the first balls or bumps of solder, subsequently pressing the interposer towards the bottom semiconductor package to a position at which the first balls or bumps of solder respectively contact the second balls or bumps of solder, adhering the second balls or bumps of solder respectively to the first balls or bumps of solder by melting the second balls or bumps of solder while the second balls or bumps of solder respectively contact the first balls or bumps of solder, and bonding a top semiconductor package to the interposer, the top semiconductor package comprising an upper substrate and an upper chip on the upper substrate.

According to the inventive concept, there is also provided a package-on-package bonding apparatus comprising a stage receiving a semiconductor package and an interposer substrate on the semiconductor package, the semiconductor package comprising a semiconductor chip, an optical system on the stage and providing a laser beam to the interposer substrate, and a pressing member between the interposer substrate and the optical system and pressing the interposer substrate against the semiconductor package. The pressing member blocks the laser beam traveling toward the semiconductor chip to selectively provide the laser beam to a portion of the semiconductor package.

DETAILED DESCRIPTION

Figure 1:
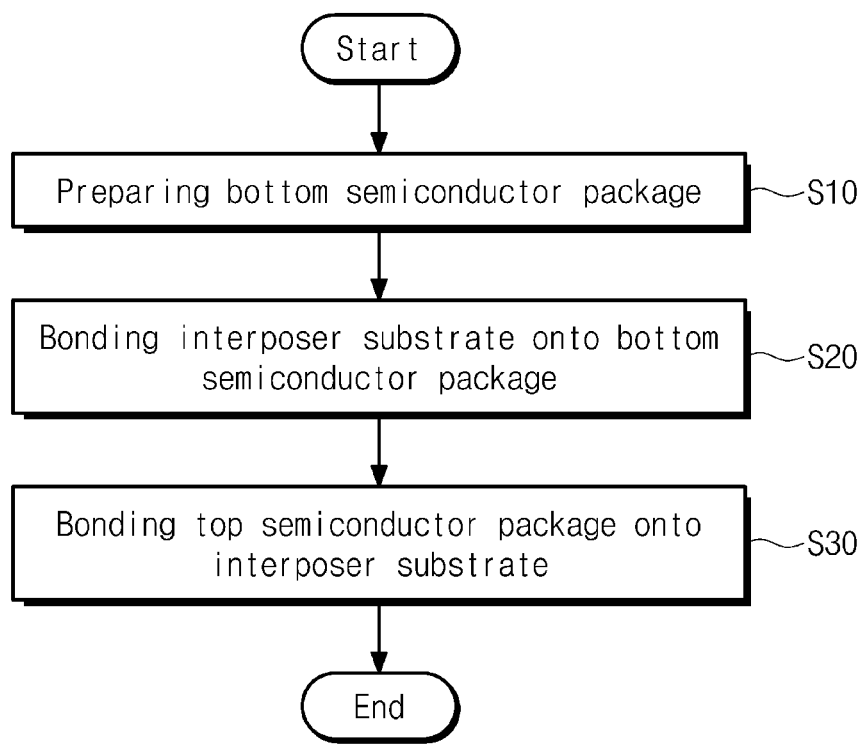
FIG. 1 is a flow chart illustrating an example of a method of manufacturing a package-on-package device according to the inventive concept.
Figure 2:
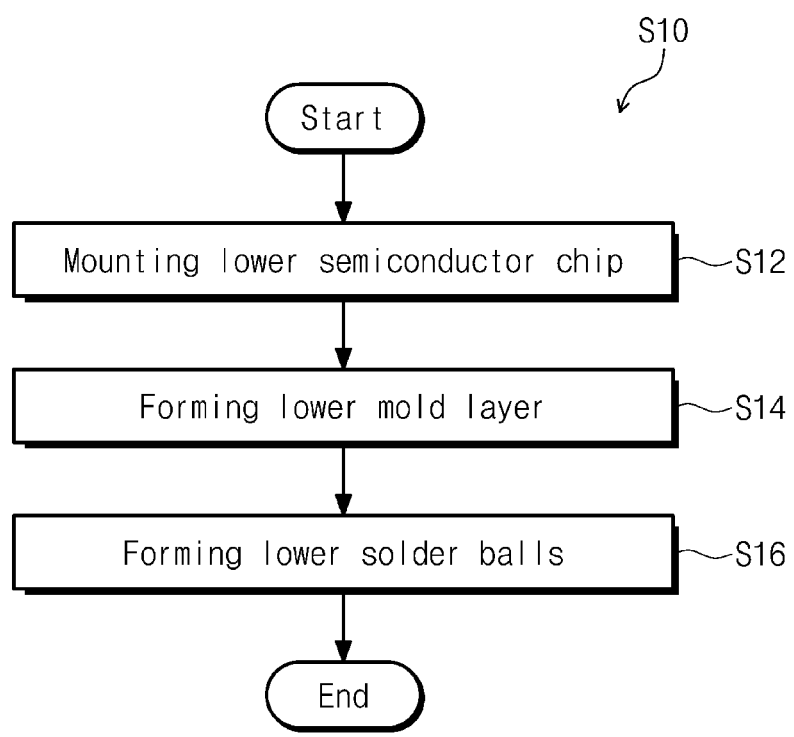
FIG. 2 is a flow chart showing an example of a routine of step S10, of the method shown in FIG. 1.

FIG. 1 shows a method of manufacturing a package-on-package device according to the inventive concept. FIG. 2 shows an example of step S10, of the method shown in FIG. 1.

Referring to FIG. 1, a method of manufacturing a package-on-package device according to the inventive concept may include a step S10 of preparing a bottom semiconductor package, a step S20 of bonding an interposer substrate to the bottom semiconductor package, and a step S30 of bonding a top semiconductor package to the interposer substrate. The bottom semiconductor package may include a logic circuit performing data computing and/or data processing in response to external input signals. The top semiconductor package may include a memory device that stores input/output data of the logic circuit. The interposer substrate may reroute signals between and/or connect the bottom and top semiconductor packages.

Referring to FIG. 2, the step S10 of preparing the bottom semiconductor package may include a step S12 of mounting a lower semiconductor chip on a lower substrate, a step S14 of forming a lower mold layer on the lower substrate on which the lower semiconductor chip is mounted, and a step S16 of forming lower solder balls.

Figure 3:
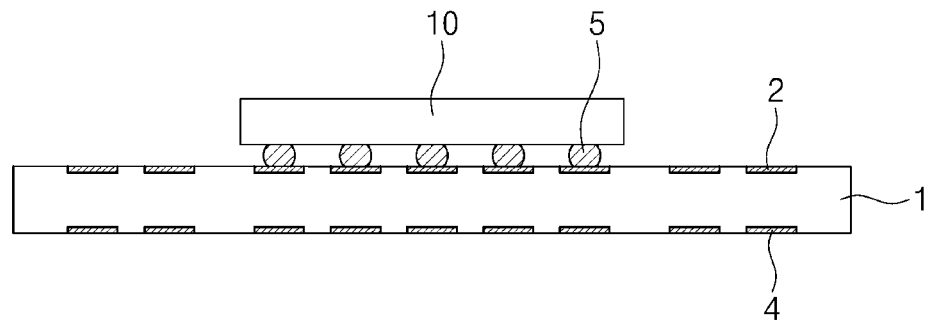
FIGS. 3, 4 and 5 cross-sectional views of a package during the course of the routine of step S10 in the example shown in FIG. 2.
Figure 4:
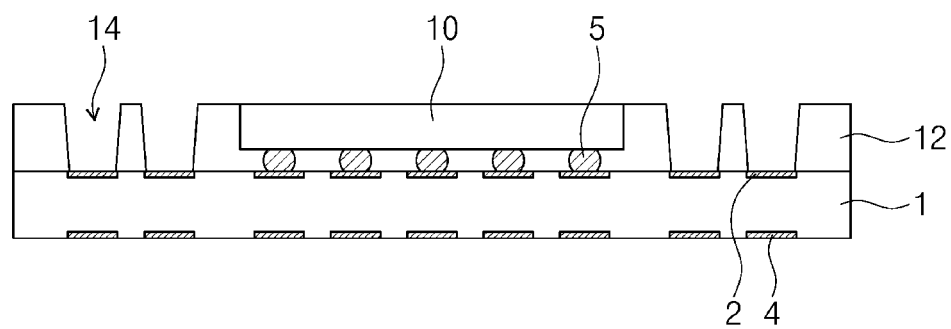
Figure 5:
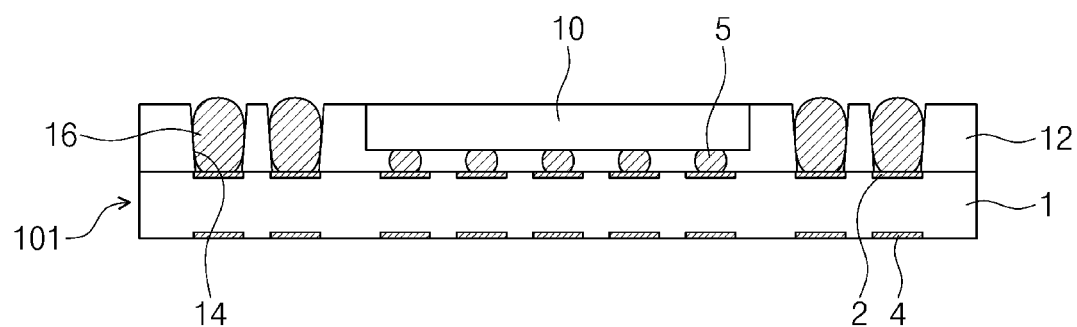

FIGS. 3 to 5 are cross-sectional views of the bottom package during the course of step S10 of FIG. 2.

Referring to FIGS. 2 and 3, a lower semiconductor chip 10 may be mounted on a lower substrate 1 (S12). The lower substrate 1 may be or include a printed circuit board. For example, the lower substrate 1 may have a plate-like substrate body, first lower pads 2 and second lower pads 4. The first lower pads 2 may be formed on a top surface of the body of the lower substrate 1. The second lower pads 4 may be formed on a bottom surface of the body of the lower substrate 1. Although not shown, the first lower pads 2 may be electrically connected within the body of the lower substrate 1 to the second lower pads 4.

The lower semiconductor chip 10 may be mounted on a center of the lower substrate 1. The lower semiconductor chip 10 may be mounted in a flip-chip bonding manner. The lower semiconductor chip 10 may be connected through first bumps 5 to the first lower pads 2. The lower semiconductor chip 10 may be or include an application processor chip. Alternatively, the lower semiconductor chip 10 may include various devices such as central processor unit (CPU), graphic processor unit (GPU), or universal serial bus (USB).

Referring to FIGS. 2 and 4, a lower mold layer 12 may be formed on the lower substrate 1 o which the lower semiconductor chip 10 has been mounted (S14). The lower mold layer 12 may surround a sidewall (sides) of the lower semiconductor chip 10 and expose a top surface of the lower semiconductor chip 10. The lower mold layer 12 may include an epoxy molding compound (EMC). The lower mold layer 12 may have one or more contact holes 14. The contact holes 14 may be formed on an outer peripheral edge region of the lower substrate 1. Respective ones of the first lower pads 2 may be exposed by the contact holes 14, which exposed first lower pads 2 may be located along the outer peripheral edge region of the top surface of the lower substrate 1.

Referring to FIGS. 2 and 5, lower solder balls 16 may be formed on the first lower pads 2 exposed by the contact holes 14 (S14). The lower solder balls 16 may be electrically connected through the lower substrate 1 either to the second lower pads 4 or to the lower semiconductor chip 10. The lower solder balls 16 may include a conductive material such as tin, lead, silver, or any alloy thereof. Alternatively, i.e., instead of the lower solder balls 16, solder paste may be formed in the contact holes 14 on the first lower pads 2 exposed by the contact holes 14. Thus, the lower solder balls 16 may be referred to as first balls or bumps of solder. Through the processes discussed above, a bottom semiconductor package 101 may be prepared.

Figure 6:
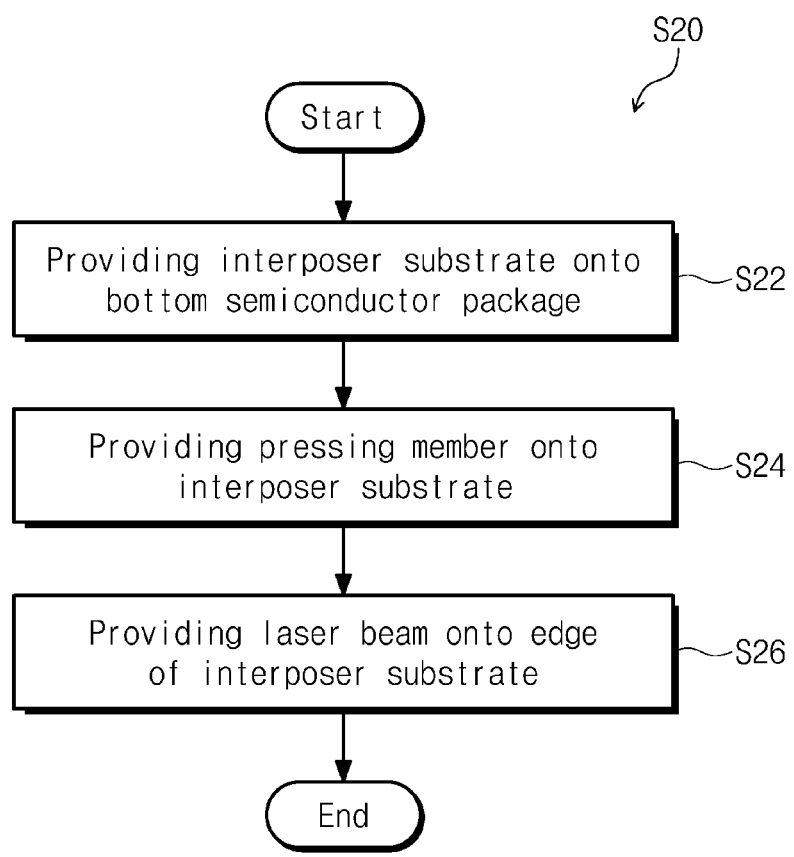
FIG. 6 is a flow chart showing an example of a routine of step S20, of the method shown in FIG. 1.
Figure 7:
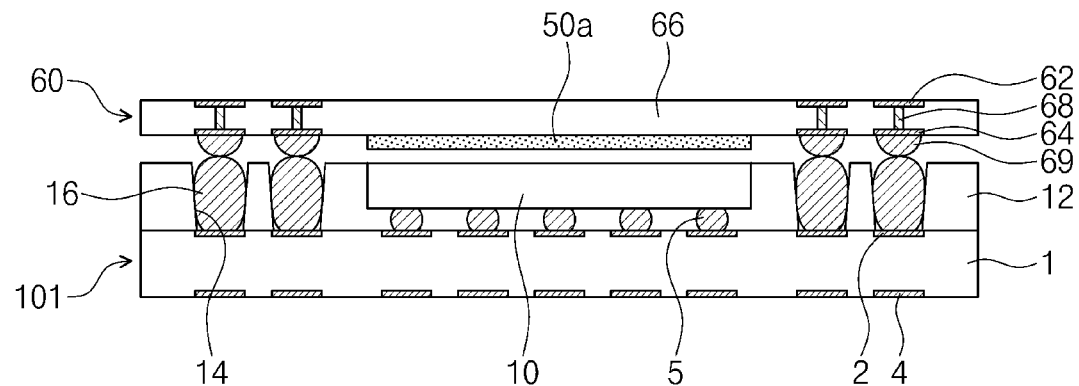
FIG. 7 is a cross-sectional of package structure during the course of the routine of step S22 in the example shown in FIG. 6.

FIG. 6 shows an example of the step S20 of FIG. 1, in which an interposer (which may be referred to herein as an "interposer substrate") is bonded onto the bottom semiconductor package 101. FIG. 7 shows an example of the step S22 of FIG. 6, in which step S22 an interposer substrate is bonded onto the bottom semiconductor package 101.

Referring to FIGS. 1, 6, and 7, an interposer substrate 60 may be bonded to the bottom semiconductor package 101 (S20). For example, the step S20 of bonding the interposer substrate 60 to the bottom semiconductor package 101 may include a step S22 of providing the interposer substrate 60 on the bottom semiconductor package 101, a step S24 of providing a pressing member on the interposer substrate 60, and a step S26 of directing a laser beam at an edge of the interposer substrate 60.

Referring to FIG. 7, the interposer substrate 60 may be provided on the bottom semiconductor package 101 (S22). A picker (not shown) may be used to provide the interposer substrate 60 on the bottom semiconductor package 101. The interposer substrate 60 may include a substrate body 66 (which will form an intermediate substrate of the package-on package), a lower insulation member 50a, first pads 62, second pads 64, vias 68, and upper solder balls 69 (which may be referred to as second balls or bumps of solder). However, the interposer substrate 60 as is the case for interposers, per se, in the semiconductor device packaging art does not include any chip. The substrate body 66 may include a plastic or ceramic sheet whose size is identical or similar to that of the lower substrate 1. The lower insulation member 50a may be formed below a center of the substrate body 66. The lower insulation member 50a may align with the lower semiconductor chip 10. The lower insulation member 50a may include a solder resist. The first pads 62 may be formed along an outer peripheral edge of the top surface of the substrate body 66. The second pads 64 may be formed along an outer peripheral edge the bottom surface of the substrate body 66. The vias 68 may be formed within the substrate body 66, connecting the first pads 62 to the second pad 64. The upper solder balls 69 may be formed below the second pads 64. The upper solder balls 69 may be thicker than the lower insulation member 50a. The upper solder balls 69 may align with the lower solder balls 16. When the substrate body 66 is flat or straight, the upper solder balls 69 may be connected to the lower solder balls 16.

Figure 8:
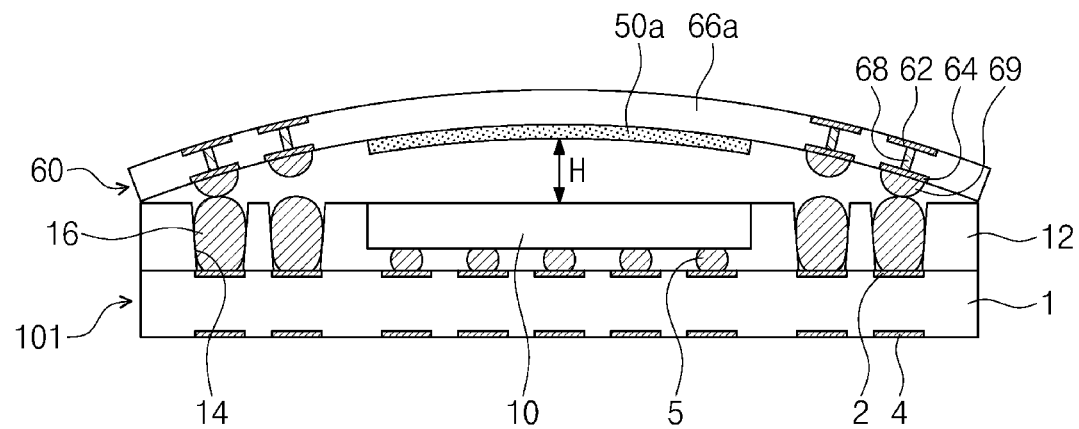
FIG. 8 is a cross-sectional view of the same package structure showing warpage of an interposer substrate of the structure.

FIG. 8 shows warpage of the interposer substrate 60 of FIG. 7.

Referring to FIG. 8, the interposer substrate 60 may have a curved substrate body 66a. A total weight of the first pads 62, the second pad 64, the vias 68, and the upper solder balls 69 formed on the edge of the interposer substrate 60 may be greater than a weight of the lower insulation member 50a formed on the center of the interposer substrate 60, with the result that the curved substrate body 66a may generally have an upwardly convex shape. In some cases, however, the curved substrate body 66a of the interposer substrate 60 may have a downwardly convex shape.

In the illustrated case, an increased gap H is present between the central part of the interposer substrate 60 and the bottom semiconductor package 101 due to the warpage of the interposer substrate 60. As a result, one or more of the upper solder balls 69 is/are separated from their corresponding lower solder ball(s) 16. If an upper solder ball 69 is separated from is corresponding lower solder ball 16, a bonding failure may occur between the interposer substrate 60 and the bottom semiconductor package 101. That is, the warpage of the interposer substrate 60 may cause the bonding failure between the interposer substrate 60 and the bottom semiconductor package 101.

Figure 9:
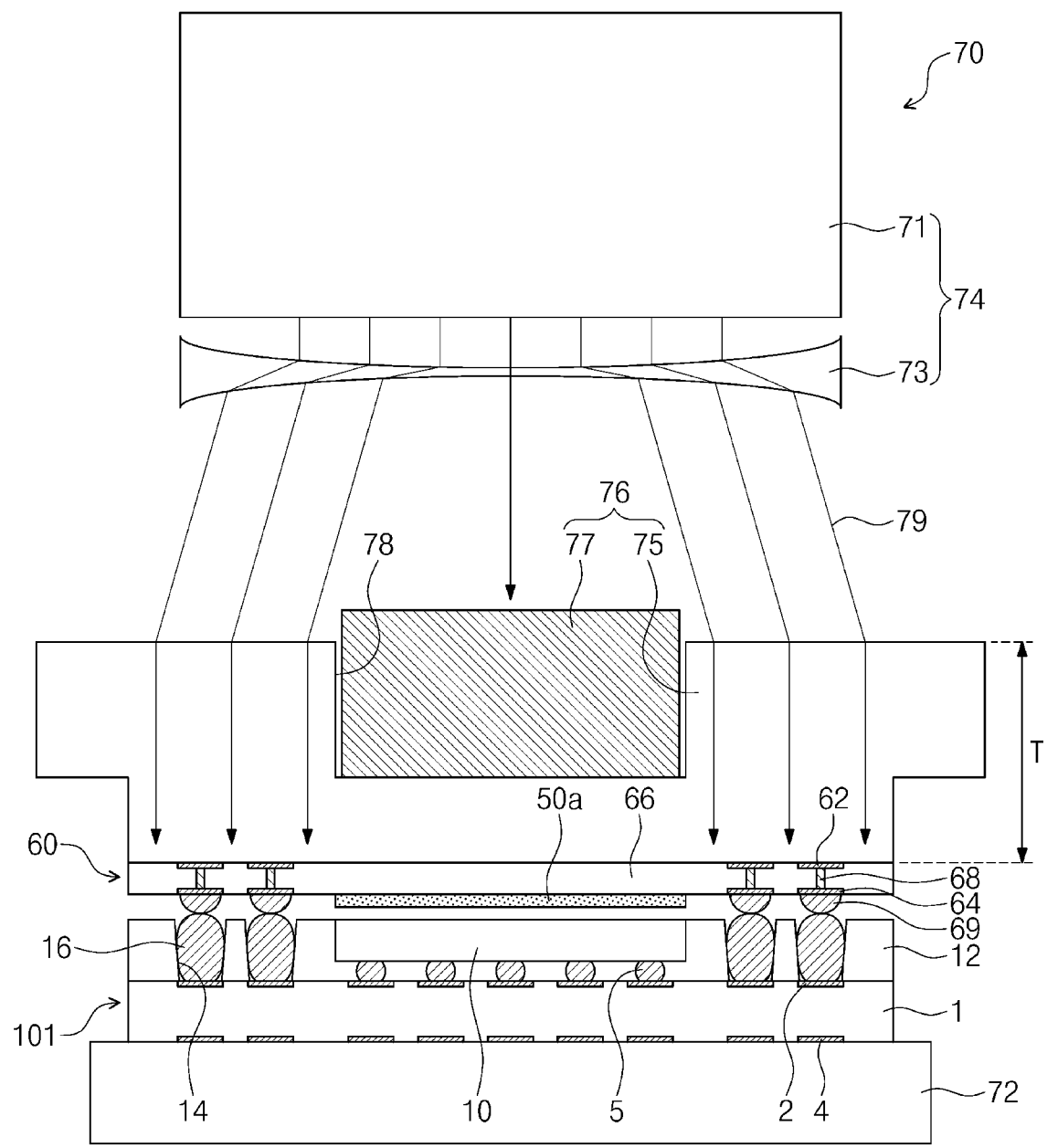
FIG. 9 is a schematic diagram of an example of a bonding apparatus configured to bond an interposer substrate to a bottom semiconductor package, according to the inventive concept.

FIG. 9 shows an example of a bonding apparatus 70 that bonds the interposer substrate 60 to the bottom semiconductor package 101.

Referring to FIGS. 6 to 9, the bonding apparatus 70 bonds the interposer substrate 60 to the bottom semiconductor package 101 such that a bonding failure will not occur due to any intrinsic curvature of the substrate body 66*a*. For example, the bonding apparatus 70 may be a laser reflow tool. In some examples, the bonding apparatus 70 includes a stage 72, an optical system 74, and a pressing member 76. The pressing member 76 may include a pressing plate 75 and a pressing block 77

The stage 72 may receive the bottom semiconductor package 101 and the interposer substrate 60. The stage 72 may be provided thereon with the interposer substrate 60 independently of or together with the bottom semiconductor package 101.

The pressing member 76 may press the interposer substrate 60 against the bottom semiconductor package 101 (S24). A robot arm (not shown) may be used to position the pressing member 76 on the interposer substrate 60. The pressing member 76 may be a compression member. The pressing member 76 may press the interposer substrate 60 against the bottom semiconductor package 101 in such a way that the upper solder balls 69 come into contact with the lower solder balls 16. The pressing member 76 may have a minimum weight in proportion to the gap H of the structure comprising the interposer 60 and bottom semiconductor package 101 and created due to curvature substrate body 66*a*. For example, when the gap H is equal to or less than about 50 µm, the weight of the pressing member 76 may be at least about 5 grams. When the gap H of is equal to or less than about 100 µm, the weight of the pressing member 76 may be at least about 20 grams.

The pressing plate 75 may cover the interposer substrate 60. The pressing plate 75 may flatten the interposer substrate 60 against the bottom semiconductor package 101. The pressing plate 75 may be made of transparent quartz. Compared with transparent glass, transparent quartz has high resistance to the heat generated by a laser beam 79 which will be discussed below, and as a result the pressing plate 75 may have a longer lifetime than one of typical plate glass.

The pressing plate 75 may have a cavity 78. The cavity 78 may be formed in an upper part at a center of the pressing plate 75. The cavity 78 may align with the lower semiconductor chip 10.

The pressing block 77 may be smaller than the pressing plate 75. The pressing block 77 may be provided on the pressing plate 75. Thus, for example, the pressing block 77 may be provided over the center (central region) of the substrate body 66, which center (central region) is bounded by the region containing the upper solder balls 69. The pressing block 77 may serve as a weight that presses the pressing plate 75 against the interposer substrate 60. The pressing block 77 may be received in the cavity 78. The cavity 78 may hold the pressing block 77 horizontally in position. An adhesive (not shown) may be used to fix the pressing block 77 to a floor of the cavity 78. The pressing block 77 may align with the lower semiconductor chip 10. The pressing block 77 may have a density greater than that of the pressing plate 75. For example, the pressing block 77 may include metal, for example, iron, SUS, tungsten, copper, lead, or any alloy thereof.

Alternatively, the pressing member 76 does not include the pressing plate 75 and the pressing block 77 is placed directly on the curved substrate body 66*a*, such that the pressing block 77 alone flattens the interposer substrate 60 against the bottom semiconductor package 101.

In another example (not shown) the pressing member 76 does not include the pressing block 77. In this case, the pressing plate 75 may have a thickness T in proportion to the gap H. That is, the greater the gap H created by the curved substrate body 66*a* the greater is the thickness T of the pressing plate 75.

The optical system 74 may be disposed on the pressing member 76. The optical system 74 may emit a laser beam 79 that propagates to the pressing member 76 and the edge of the interposer substrate 60 such that the upper solder balls 69 are melted and adhered to the lower solder balls 16 (S26). To this end, the optical system 74 may include a light source 71 generating the laser beam 79, and an objective 73 that focuses the laser beam 79 onto the pressing plate 75 and the pressing block 77. The objective 73 may be disposed below the light source 71. The objective 73 may comprise a biconcave lens as shown in FIG. 9.

The laser beam 79 may be propagate to the upper and lower solder balls 69 and 16 after passing through an edge of the pressing plate 75. The objective 73 may cause the laser beam 79 emitted by the light source 71 to diverge toward the upper solder balls 69. As the distance between the objective 73 and the interposer substrate 60 increases relative to the thickness T of the pressing plate 75, the upper solder balls 69 absorb less of the energy of the laser beam 79. In consideration of this, it is also noted that the absorption efficiency of the pressing block 77 may be increased by minimizing the distance between the objective 73 and the interposer substrate 60. Because the density of the pressing block 77 is greater than that of the pressing plate 75, the pressing block 77 may help minimize the thickness T of the pressing plate 75, which thickness T would otherwise have to be relatively great owing to the gap H between the substrate body 66 and the bottom semiconductor package 101.

The pressing block 77 may absorb the laser beam 79 traveling toward the center of the interposer substrate 60 and as a result may block the laser beam 79 from propagating to the lower semiconductor chip 10. Accordingly, the pressing block 77 may cause the laser beam 79 to selectively irradiate the region of the interposer 60 containing the upper solder balls 69. More specifically, the laser beam 79 may be selectively provided to the upper and lower solder balls 69 and 16 after passing through the pressing plate 75 surrounding the pressing block 77. The lower and upper solder balls 16 and 69 may be irradiated by the laser beam for a time period ranging about 10 msec. to about 5 sec.

Although not shown, a plurality of the bottom semiconductor packages 101 and interposer substrates 60 may be provided on the stage 72. In this case, the bonding apparatus 70 may have a plurality of the pressing plates 75 and the pressing blocks 77. The pressing plates 75 may be loaded in a jig, and the pressing blocks 77 may be provided on the pressing plates 75, respectively. The laser beam 79 may be independently and/or sequentially directed towards the pairs of pressing plates 75 and pressing blocks 77.

Figure 10:
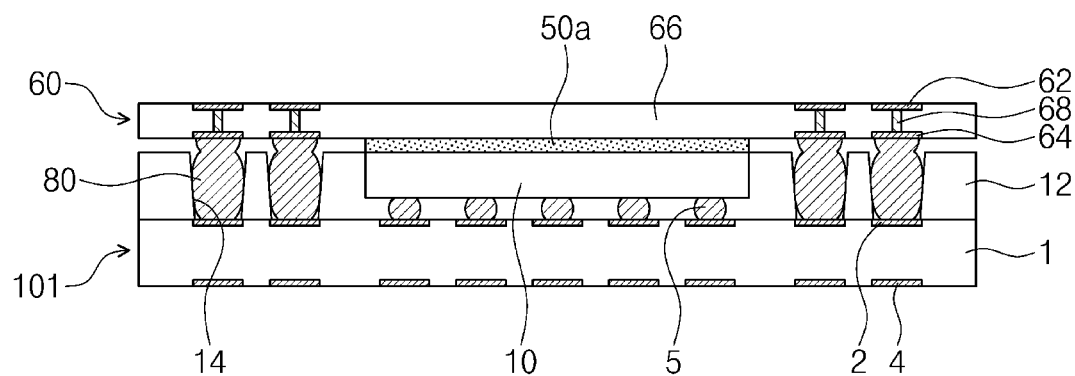
FIG. 10 is a cross-sectional view of the package structure shown in FIG. 7 in a state in which upper solder balls have been melted and adhered to lower solder balls.

FIG. 10 shows solder structures 80 in which the upper and lower solder balls 69 and 16 shown in FIG. 7 have been melted and adhered to one another.

Referring to FIG. 10, the lower and upper solder balls 16 and 69 may absorb the energy of the laser beam 79, thereby forming the solder structures 80. For example, when the laser beam 79 heats the upper solder balls 69 to a temperature equal to or higher than about 245° C., the upper solder balls 69 may be melted and adhered to the lower solder balls 16.

Although not shown, an under-fill layer may be formed between the interposer substrate 60 and the lower mold layer 12. The lower mold layer 12 and the under-fill layer may electrically insulate the solder structures 80 from one another.

Figure 11:
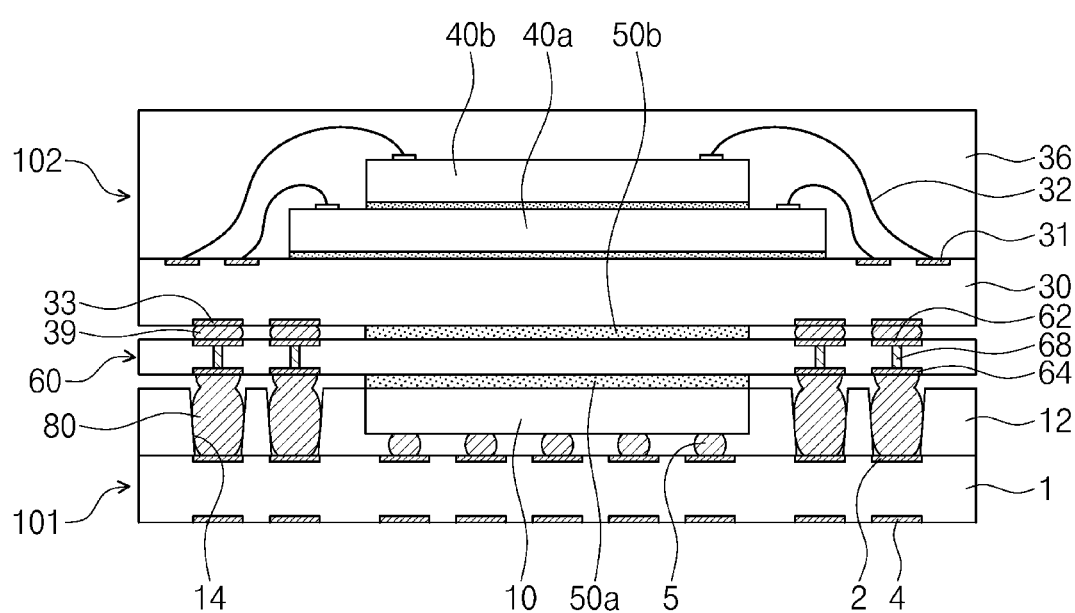
FIG. 11 is a cross-sectional view of an example of a package on package device according to the inventive concept.

Referring to FIGS. 1 and 11, the top semiconductor package 102 is bonded to the interposer substrate 60 (S30). For example, the top semiconductor package 102 may be flip-chip bonded to the interposer substrate 60. The top semiconductor package 102 may be fabricated by processes identical or similar to those discussed with reference to FIGS. 3 and 4. In some examples, the top semiconductor package 102 includes an upper substrate 30, first and second upper semiconductor chips 40a and 40b, bonding wires 32, an upper mold layer 36, an upper insulation member 50b, and second bumps 39.

The upper substrate 30 may be or include a printed circuit board. For example, the upper substrate 30 may include first and second upper pads 31 and 33. The first upper pads 31 may be formed on a top surface of the upper substrate 30. The second upper pads 33 may be formed on a bottom surface of the upper substrate 30. The first and second upper pads 31 and 33 may be electrically connected by wiring (e.g., a wiring layer(s) and vias) within the upper substrate 30.

The first and second upper semiconductor chips 40a and 40b may be sequentially stacked on the upper substrate 30. At least one of the first and second upper semiconductor chips 40a and 40b may be a memory chip.

The bonding wires 32 may connect the first and second upper semiconductor chips 40a and 40b to the first upper pads 31. A wire bonder (not shown) may be used to bond the bonding wires 32 to the first and second upper semiconductor chips 40a and 40b and to the first upper pads 31. Alternatively, at least one of the first and second upper semiconductor chips 40a and 40b may be mounted on the upper substrate 30 in a flip-chip manner.

The upper mold layer 36 may be formed to cover the first upper pads 31, the first and second upper semiconductor chips 40a and 40b, and the bonding wires 32. The upper mold layer 36 may include an epoxy molding compound (EMC).

The upper insulation member 50b may be formed below a center of the upper substrate 30. The upper insulation member 50b may insulate the upper substrate 30 and the interposer substrate 60 from each other. The upper insulation member 50b may include a solder resist.

The second bumps 39 may be formed along the outer peripheral edge of the bottom surface of the upper substrate 30. The second bumps 39 may connect the second upper pads 33 to the first pads 62 of the interposer substrate 60. Thus, the second bumps 39 may be interposed between the second upper pads 33 and the first pads 62 of the interposer substrate 60.

Although not shown, after the top semiconductor package 102 is bonded to the bottom semiconductor package 101 via the interposer 60, solder bumps may be formed on the second lower pads 4 of the bottom semiconductor package 101.

According to an aspect of the inventive concept, a method of manufacturing a package-on-package device uses a pressing member configured to press a curved interposer substrate against a bottom semiconductor package. Therefore, bonding failure may be prevented between the interposer substrate and the bottom semiconductor package.

Finally, examples of the inventive concept have been described above in detail. The inventive concept may, however, be put into practice in many different ways and should not be construed as being limited to the examples described above. Rather, these examples were described so that this disclosure is thorough and complete, and fully conveys the inventive concept to those skilled in the art. Thus, the true spirit and scope of the inventive concept is not limited by the examples described above but by the following claims.

What is claimed is:

1. A method of manufacturing a package-on-package device, the method comprising:
   providing a bottom semiconductor package comprising a lower substrate, lower solder balls on an outer peripheral part of a top surface of the lower substrate, and a lower chip on central part of the top surface of the lower substrate;
   bonding an interposer substrate comprising upper solder balls to the bottom semiconductor package; and
   bonding a top semiconductor package to the interposer substrate, the top semiconductor package comprising an upper substrate and an upper chip on the upper substrate, wherein:
   the bonding of the interposer substrate to the bottom semiconductor package comprises:
      providing the interposer substrate on the bottom semiconductor package with the upper solder balls of the interposer substrate aligned with the lower solder balls of the bottom semiconductor package;
      providing a pressing member on the interposer substrate to press the interposer substrate against the bottom semiconductor package, wherein the pressing member includes a pressing plate covering the interposer substrate and a pressing block disposed on the pressing plate, the pressing block aligned with the lower chip; and
      irradiating, directly through the pressing plate, the interposer substrate with a laser beam to adhere the lower solder balls to the upper solder balls and block the laser beam into the lower chip using the pressing block.

2. The method of claim 1, wherein the pressing plate comprises quartz that is transparent with respect to the laser beam.

3. The method of claim 1, wherein the pressing block is smaller than the pressing plate and provided on a central region of the interposer substrate.

4. The method of claim 3, wherein the pressing block has a density greater than that of the pressing plate.

5. The method of claim 3, wherein the bonding of the interposer substrate to the bottom semiconductor package comprises aligning the pressing block with the lower chip and blocking the laser beam traveling toward the lower chip with the pressing block to thereby selectively heat the upper solder balls with the laser beam.

6. The method of claim 3, wherein the pressing plate comprises a cavity in which the pressing block is fixed.

7. The method of claim 3, wherein the pressing block comprises metal.

8. The method of claim 1, wherein the interposer substrate has an upwardly convex substrate body when the interposer substrate is provided on the bottom semiconductor package.

9. The method of claim 1, wherein:
   the interposer substrate further comprises an insulation member in a region between respective ones of the upper solder balls, and
   the upper solder balls are thicker than the insulation member.

10. A method of manufacturing a package-on-package device, the method comprising:

providing a bottom semiconductor package comprising a lower substrate having a top surface and a bottom surface, first balls or bumps of solder spaced from one another along an outer peripheral part of the top surface of the lower substrate, and a lower chip on central part of the top surface of the lower substrate;

providing an interposer comprising an intermediate substrate having a top surface and a bottom surface, second balls or bumps of solder spaced from one another along an outer peripheral part of the bottom surface of the intermediate substrate, and conductive pads disposed on the top surface of the intermediate substrate and vias extending in the intermediate substrate and connecting the conductive pads to the second balls or bumps of solder;

setting the interposer on a top the bottom semiconductor package with the bottom surface of the intermediate substrate facing the top surface of the lower substrate and the second balls or bumps of solder disposed in correspondence with the first balls or bumps of solder;

subsequently providing a pressing member on the interposer to press the interposer towards the bottom semiconductor package to a position at which the first balls or bumps of solder respectively contact the second balls or bumps of solder, wherein the pressing member includes a plate covering the interposer and a block disposed on the plate, the pressing member aligned with the lower chip;

while the second balls or bumps of solder respectively contact the first balls or bumps of solder, adhering the second balls or bumps of solder respectively to the first balls or bumps of solder by irradiating, directly through the plate, the interposer with a laser beam to melt the second balls or bumps of solder and block the laser beam into the lower chip using the block; and bonding a top semiconductor package to the interposer, the top semiconductor package comprising an upper substrate and an upper chip on the upper substrate.

11. The method of claim 10, wherein a region of the interposer containing the second balls or bumps of solder is irradiated with the laser beam.

12. The method of claim 10, wherein:
the intermediate substrate of the interposer is upwardly convex when the interposer is set atop the bottom semiconductor package, and
the block is set over central parts of the interposer and the bottom semiconductor package.

13. The method of claim 10, wherein:
the central part of the interposer is a region bounded by a region of the interposer containing the second balls or bumps of solder, and
the block covers the central part only of the interposer.

14. The method of claim 10, wherein the pressing of the interposer towards the bottom semiconductor package comprises covering the interposer with the plate.

15. The method of claim 14, wherein the plate has a transparency to light.

16. The method of claim 15, wherein the plate is of quartz.

17. The method of claim 15, wherein:
the pressing of the interposer towards the bottom semiconductor package further comprises setting a block of material, having a density greater than that of the plate, over central parts only of the interposer and the bottom semiconductor package, and
the block absorbs the laser beam incident thereon.

18. The method of claim 17, wherein the pressing of the interposer towards the bottom semiconductor package comprises flattening the interposer under a combined weight of the block and the plate.

* * * * *